United States Patent
Negley et al.

(10) Patent No.: US 7,569,407 B2
(45) Date of Patent: *Aug. 4, 2009

(54) METHODS OF COATING SEMICONDUCTOR LIGHT EMITTING ELEMENTS BY EVAPORATING SOLVENT FROM A SUSPENSION

(75) Inventors: Gerald H. Negley, Carrboro, NC (US); Michael Leung, Port Hueneme, CA (US)

(73) Assignee: Cree, Inc., Durham, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/799,702

(22) Filed: May 1, 2007

(65) Prior Publication Data
US 2007/0224716 A1 Sep. 27, 2007

Related U.S. Application Data

(63) Continuation of application No. 10/946,587, filed on Sep. 21, 2004, now Pat. No. 7,217,583.

(51) Int. Cl.
 H01L 21/00 (2006.01)
 H01L 29/06 (2006.01)
(52) U.S. Cl. .............................. 438/29; 438/27; 257/13; 257/98; 257/E33.067
(58) Field of Classification Search ................... 438/27, 438/29, 30, 34, 35, 38, 42, 65; 257/13, 79, 257/83, 84, 88, 89, 98, E33.067
See application file for complete search history.

(56) References Cited

U.S. PATENT DOCUMENTS

| | | | |
|---|---|---|---|
| 4,733,335 A | 3/1988 | Serizawa et al. | 362/503 |
| 4,918,497 A | 4/1990 | Edmond | 357/17 |
| 4,935,665 A | 6/1990 | Murata | 313/500 |
| 4,946,547 A | 8/1990 | Palmour et al. | 156/643 |
| 4,966,862 A | 10/1990 | Edmond | 437/100 |
| 5,027,168 A | 6/1991 | Edmond | 357/17 |
| 5,200,022 A | 4/1993 | Kong et al. | 156/612 |
| 5,210,051 A | 5/1993 | Carter et al. | 437/107 |

(Continued)

FOREIGN PATENT DOCUMENTS

EP 1059678 12/2000

(Continued)

OTHER PUBLICATIONS

Office Action from European Associate Feb. 27, 2008.

(Continued)

*Primary Examiner*—Kevin M Picardat
(74) *Attorney, Agent, or Firm*—Koppel, Patrick, Heybl & Dawson

(57) ABSTRACT

Semiconductor light emitting devices are fabricated by placing a suspension including phosphor particles suspended in solvent on at least a portion of a light emitting surface of a semiconductor light emitting element, and evaporating at least some of the solvent to cause the phosphor particles to deposit on at least a portion of the light emitting surface. A coating including phosphor particles is thereby formed on at least a portion of the light emitting surface. Particles other than phosphor also may be coated and solutions wherein particles are dissolved in solvent also may be used.

30 Claims, 4 Drawing Sheets

U.S. PATENT DOCUMENTS

| | | | |
|---|---|---|---|
| 5,277,840 A | 1/1994 | Osaka et al. | 252/301.36 |
| 5,338,944 A | 8/1994 | Edmond et al. | 257/76 |
| RE34,861 E | 2/1995 | Davis | 437/100 |
| 5,393,993 A | 2/1995 | Edmond et al. | 257/77 |
| 5,416,342 A | 5/1995 | Edmond et al. | 257/76 |
| 5,523,589 A | 6/1996 | Edmond et al. | 257/77 |
| 5,604,135 A | 2/1997 | Edmond et al. | 437/22 |
| 5,614,131 A | 3/1997 | Mukerji et al. | 264/1.9 |
| 5,631,190 A | 5/1997 | Negley | 438/33 |
| 5,739,554 A | 4/1998 | Edmond et al. | 257/103 |
| 5,766,987 A | 6/1998 | Mitchell et al. | 438/126 |
| 5,813,753 A | 9/1998 | Vriens et al. | 362/293 |
| 5,858,278 A | 1/1999 | Itch et al. | 252/301.4 |
| 5,912,477 A | 6/1999 | Negley | 257/95 |
| 5,923,053 A | 7/1999 | Jakowetz et al. | 257/95 |
| 5,959,316 A | 9/1999 | Lowery | 257/98 |
| 5,998,925 A | 12/1999 | Shimizu | 313/503 |
| 6,001,671 A | 12/1999 | Fjelstad | 438/112 |
| 6,066,861 A | 5/2000 | Horn et al. | 257/99 |
| 6,069,440 A | 5/2000 | Shimizu et al. | 428/522 |
| 6,087,202 A | 7/2000 | Exposito et al. | 438/113 |
| 6,120,600 A | 9/2000 | Edmond et al. | 117/89 |
| 6,132,072 A | 10/2000 | Turnbull et al. | 362/494 |
| 6,139,304 A | 10/2000 | Centofante | 425/121 |
| 6,153,448 A | 11/2000 | Takahashi et al. | 438/114 |
| 6,187,606 B1 | 2/2001 | Edmond et al. | 438/46 |
| 6,201,262 B1 | 3/2001 | Edmond et al. | 257/77 |
| 6,252,254 B1 | 6/2001 | Soules et al. | 257/89 |
| 6,329,224 B1 | 12/2001 | Nguyen et al. | 438/127 |
| 6,331,063 B1 | 12/2001 | Kamada et al. | 362/237 |
| 6,338,813 B1 | 1/2002 | Hsu et al. | 264/272.14 |
| 6,376,277 B2 | 4/2002 | Corisis | 438/106 |
| 6,404,125 B1 | 6/2002 | Garbuzou | 313/499 |
| 6,531,328 B1 | 3/2003 | Chen | 438/26 |
| 6,583,444 B2 | 6/2003 | Fjelstad | 257/82 |
| 6,624,058 B1 | 9/2003 | Kazama | 438/612 |
| 6,642,652 B2 | 11/2003 | Collins, III | 313/512 |
| 6,653,765 B1 | 11/2003 | Levinson et al. | 313/112 |
| 6,733,711 B2 | 5/2004 | Durocher et al. | 264/272.14 |
| 6,759,266 B1 | 7/2004 | Hoffman | 438/64 |
| 6,791,119 B2 | 9/2004 | Slater, Jr. et al. | 257/99 |
| 6,793,371 B2 | 9/2004 | Lamke et al. | 362/241 |
| 6,812,500 B2 | 11/2004 | Reeh et al. | 257/98 |
| 6,853,010 B2 | 2/2005 | Slater, Jr. et al. | 257/98 |
| 6,860,621 B2 | 3/2005 | Bachl et al. | 362/373 |
| 6,919,683 B1 * | 7/2005 | Jang | 313/503 |
| 6,958,497 B2 | 10/2005 | Emerson et al. | 257/94 |
| 7,023,019 B2 | 4/2006 | Maeda et al. | 257/79 |
| 7,029,935 B2 | 4/2006 | Negley et al. | 438/29 |
| 7,049,159 B2 | 5/2006 | Lowery | 438/22 |
| 7,183,587 B2 | 2/2007 | Negley et al. | 257/99 |
| 7,202,598 B2 | 4/2007 | Juestel et al. | 313/503 |
| 7,217,583 B2 * | 5/2007 | Negley et al. | 438/29 |
| 7,286,296 B2 | 10/2007 | Chaves et al. | 359/641 |
| 2002/0001869 A1 | 1/2002 | Fjelstad | |
| 2002/0006040 A1 | 1/2002 | Kamada et al. | |
| 2002/0070449 A1 | 6/2002 | Yagi et al. | |
| 2002/0096789 A1 | 7/2002 | Bolken | |
| 2002/0123164 A1 | 9/2002 | Slater, Jr. et al. | |
| 2002/0185965 A1 | 12/2002 | Collins, III et al. | |
| 2003/0006418 A1 | 1/2003 | Emerson et al. | |
| 2003/0038596 A1 | 2/2003 | Ho | |
| 2003/0066311 A1 | 4/2003 | Li et al. | |
| 2003/0121511 A1 | 7/2003 | Hashimura et al. | |
| 2003/0207500 A1 | 11/2003 | Pichler et al. | |
| 2004/0004435 A1 | 1/2004 | Hsu | |
| 2004/0012958 A1 | 1/2004 | Hashimoto et al. | |
| 2004/0037949 A1 | 2/2004 | Wright | |
| 2004/0038442 A1 | 2/2004 | Kinsman | |
| 2004/0041222 A1 | 3/2004 | Loh | |
| 2004/0056260 A1 | 3/2004 | Slater, Jr. et al. | |
| 2004/0106234 A1 | 6/2004 | Sorg et al. | |
| 2005/0002168 A1 | 1/2005 | Narhi et al. | |
| 2005/0265404 A1 | 12/2005 | Ashdown | |
| 2006/0001046 A1 | 1/2006 | Batres et al. | |
| 2006/0157721 A1 | 7/2006 | Tran et al. | |
| 2007/0096131 A1 | 5/2007 | Chandra | |
| 2008/0006815 A1 | 1/2008 | Wang et al. | |

FOREIGN PATENT DOCUMENTS

| | | |
|---|---|---|
| EP | 1138747 | 10/2001 |
| EP | 1198016 A2 | 4/2002 |
| EP | 1367655 | 12/2003 |
| EP | 1385215 A2 | 1/2004 |
| EP | 1724848 A | 11/2006 |
| EP | 1724848 A2 | 11/2006 |
| FR | 2704690 | 11/1994 |
| FR | 2704690 A | 11/1994 |
| JP | 2000002802 | 1/2000 |
| JP | 2000208820 A | 7/2000 |
| JP | 2002009097 A | 1/2002 |
| JP | 2005298817 | 10/2005 |
| JP | 2006054209 | 2/2006 |
| WO | WO0124283 A | 4/2001 |
| WO | WO0124283 A1 | 4/2001 |
| WO | WO03021691 A1 | 3/2003 |
| WO | WO2005101909 | 10/2005 |
| WO | WO2006033695 A2 | 3/2006 |
| WO | WO2006036251 A1 | 4/2006 |
| WO | WO2007018560 | 2/2007 |

OTHER PUBLICATIONS

International Materials Reviews, "Materials for Field Emission Displays", A. P. Burden 2001, vol. 46., pp. 1-62.
Nichia Corp White Led Part No. NSPW300BS, Specification for Nichia White Led, Model NSPW300BS Jan. 14, 2004.
Nichia Corp. White Led Part No. NSPW312BS, Specification for Nichia White Led, Model NSPW312BS Jan. 14, 2004.
Lau, John, "Flip-Chip Technologies", McGraw Hill, 1996.
NPO-30394 Electrophoretic Deposition for Fabricating Microbatteries p. 1-2, NASA Tech Briefs Issue May 3, 2003.
PCT Search Report and Written Opinion Oct. 31, 2007.
PCT International Search Report and Written Opinion, PCT/US2007/024366,Date: Jul. 15, 2008.
Office Action re related U.S. Appl. No. 10/666,399, filed Sep. 5, 2008.
First Office Action for Chinese Patent Application No. 200580031382.3, Date: Jul. 18, 2008 Publication No. JP 2002-50799A, Date Feb. 15, 2002.
International Search Report for PCT/US2007/024367, Dated: Oct. 22, 2008.
Official Notice of Rejection re related Japanese Patent Application No. 2007-533459, Dated: Jul. 29, 2008.
Patent Abstracts of Japan, Pub. No. 2001-181613,Date: Jul. 3, 2001.
Patent Abstracts of Japan, Pub. No. 11-040858, Date: Feb. 12, 1999.
Patent Abstracts of Japan, Pub. No. 2004-221185, Date: Aug. 5, 2004.
Official Notice of Final Decision of Rejection re: related Japanese Patent Application No. 2007-533459, dated: Dec. 26, 2008.
Rejection Decision re: related Chinese Patent Application No. 200580031382.3, dated Feb. 2, 2009.
Communication pursuant to Article 94 (3) EPC re: related European Application No. 05808825.3, dated: Feb. 18, 2009.

* cited by examiner

METHODS OF COATING SEMICONDUCTOR LIGHT EMITTING ELEMENTS BY EVAPORATING SOLVENT FROM A SUSPENSION

This application is a continuation of and claims the benefit of U.S. patent application Ser. No. 10/946,587 to Negley et al., filed Sep. 21, 2004 now U.S. Pat. No. 7,217,583.

FIELD OF THE INVENTION

This invention relates to fabrication of microelectronic devices, and more particularly to methods of fabricating semiconductor light emitting devices.

BACKGROUND OF THE INVENTION

Semiconductor light emitting devices, such as Light Emitting Diodes (LEDs) or laser diodes, are widely used for many applications. As is well known to those having skill in the art, a semiconductor light emitting device includes a semiconductor light emitting element having one or more semiconductor layers that are configured to emit coherent and/or incoherent light upon energization thereof. It is also known that a semiconductor light emitting device generally is packaged to provide external electrical connections, heat sinking, lenses or waveguides, environmental protection and/or other functions.

Continued developments in LEDs have resulted in highly efficient and mechanically robust light sources that can cover the visible spectrum and beyond. These attributes, coupled with the potentially long service life of solid state devices, may enable a variety of new display applications, and may place LEDs in a position to compete with the well entrenched incandescent and fluorescent lamps.

It may be desirable to provide a phosphor for an LED, for example to provide solid-state lighting. In one example, LEDs that are used for solid-state white lighting may produce high radiant flux output at short wavelengths, for example in the range of about 380 nm to about 480 nm. One or more phosphors may be provided, wherein the short wavelength, high energy photon output of the LED is used to excite the phosphor, in part or entirely, to thereby down-convert in frequency some or all of the LED's output to create the appearance of white light.

As one specific example, ultraviolet output from an LED at about 390 nm may be used in conjunction with red, green and blue phosphors, to create the appearance of white light. As another specific example, blue light output at about 470 nm from an LED may be used to excite a yellow phosphor, to create the appearance of white light by transmitting some of the 470 nm blue output along with some secondary yellow emission occurring when part of the LEDs output is absorbed by the phosphor.

Phosphors may be included in a semiconductor light emitting device using many conventional techniques. In one technique, phosphor is coated inside and/or outside the plastic shell of an LED. In other techniques, phosphor is coated on the semiconductor light emitting device itself, for example using electrophoretic deposition. In still other techniques, a drop of a material, such as epoxy that contains phosphor therein, may be placed inside the plastic shell, on the semiconductor light emitting device and/or between the device and the shell. This technique may be referred to as a "glob top". The phosphor coatings may also incorporate an index matching material and/or a separate index matching material may be provided. LEDs that employ phosphor coatings are described, for example, in U.S. Pat. Nos. 6,252,254; 6,069,440; 5,858,278; 5,813,753; 5,277,840; and 5,959,316.

Moreover, published United States Patent Application No. US 2004/0056260 A1, published on Mar. 25, 2004, entitled Phosphor-Coated Light Emitting Diodes Including Tapered Sidewalls, and Fabrication Methods Therefor, the disclosure of which is hereby incorporated herein by reference in its entirety as if set forth fully herein, describes a light emitting diode that includes a substrate having first and second opposing faces and a sidewall between the first and second opposing faces that extends at an oblique angle from the second face towards the first face. A conformal phosphor layer is provided on the oblique sidewall. The oblique sidewall can allow more uniform phosphor coatings than conventional orthogonal sidewalls.

SUMMARY OF THE INVENTION

Semiconductor light emitting devices are fabricated, according to some embodiments of the present invention, by placing a suspension comprising phosphor particles suspended in solvent on at least a portion of a light emitting surface of a semiconductor light emitting element, and evaporating at least some of the solvent to cause the phosphor particles to deposit on at least a portion of the light emitting surface. A coating comprising phosphor particles is thereby formed on at least a portion of the light emitting surface.

In some embodiments, substantially all of the solvent is evaporated. In some embodiments, evaporation of at least some of the solvent causes the phosphor particles to uniformly deposit. In other embodiments, substantially all of the solvent is evaporated, to cause the phosphor particles to uniformly deposit on all the light emitting surface.

In some embodiments, the suspension comprises phosphor particles suspended in solvent and binder, so that evaporating at least some of the solvent causes the phosphor particles and the binder to deposit on at least a portion of the light emitting surface. In other embodiments, phosphor particles and light scattering particles are suspended in the solvent, so that evaporating causes the phosphor particles and the light scattering particles to deposit on at least a portion of the light emitting surface.

In other embodiments, the light emitting surface of the semiconductor light emitting element is in a cavity, and the suspension comprising phosphor particles suspended in solvent is placed in the cavity. The cavity can, thus, confine the solvent system for controlled evaporation. In these embodiments, a mounting substrate may be provided for a semiconductor light emitting device including the cavity therein, and the semiconductor light emitting element may be mounted in the cavity. In some embodiments, the cavity includes a cavity floor, and the light emitting element is on the cavity floor, such that the light emitting surface protrudes away from the cavity floor. In these embodiments, evaporating at least some of the solvent can cause the phosphor particles to deposit on at least a portion of the light emitting surface that protrudes away from the cavity floor and on at least a portion of the cavity floor. In other embodiments, a uniform deposit of phosphor particles may be provided. In some embodiments, a uniform deposit of phosphor particles may be provided on the entire face and sidewall(s) of the light emitting surface.

In some embodiments of the invention, the suspension comprising phosphor particles suspended in solvent is agitated while performing the placing and/or the evaporating. Agitation can promote uniform suspension of the phosphor particles in the solvent. Moreover, in some embodiments, the solvent comprises Methyl Ethyl Ketone (MEK), alcohol, Amyl Acetate, toluene and/or other conventional solvent system(s). In other embodiments, the binder comprises cellulose. In still other embodiments, the light scattering particles comprise $SiO_2$, fumed silica and/or aerogel particles.

The above-described embodiments have focused primarily on causing phosphor particles and/or light scattering particles to deposit on at least a portion of a light emitting surface of a semiconductor light emitting element. However, in other embodiments of the invention, any other particles suspended in solvent may be deposited on at least a portion of the light emitting surface by evaporating at least some of the solvent. For example, nanocrystals (such as CdSe nanophosphors), nanoparticles such as $TiO_2$ and/or conductive particles (such as conductive tin oxide or conductive indium tin oxide) suspended in solvent may be deposited.

Moreover, other embodiments of the invention can cause any solute that is dissolved in solvent to deposit on at least a portion of the light emitting surface. For example, silicone (or other inorganic compounds) and/or polymer (or other organic compounds) solute that is dissolved in solvent may be deposited. More specifically, in these embodiments, a solution comprising solute dissolved in solvent is placed on at least a portion of a light emitting surface of a semiconductor light emitting element. At least some of the solvent is evaporated, to cause the solute to deposit on at least a portion of the light emitting surface. A coating comprising the solute is thereby formed on at least a portion of the light emitting surface.

DETAILED DESCRIPTION

Figure 1A:
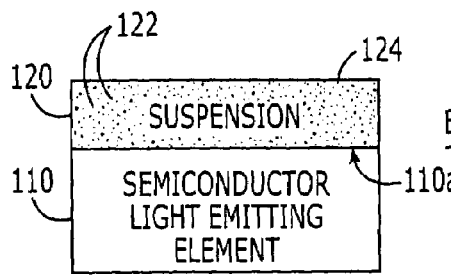
FIGS. 1A and 1B, 2A and 2B, 3A and 3B, 4A and 4B, 5A and 5B, and 6A and 6B are cross-sectional views of semiconductor light emitting devices during intermediate fabrication steps according to various embodiments of the present invention.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. As used herein the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element such as a layer or region is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Furthermore, relative terms, such as "lower", "base", or "horizontal", and "upper", "top", or "vertical" may be used herein to describe one element's relationship to another element as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated, typically, may be rounded. Thus, the regions illustrated in the figures are schematic in nature and their shapes are not intended to illustrate the precise shape of a region and are not intended to limit the scope of the present invention. Moreover, terms such as "horizontal", "vertical" and "perpendicular" indicate general directions or relationships rather than precise 0° or 90° orientations.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Finally, as used herein, a "suspension" means a two-phase solid-liquid system in which solid particles are mixed with, but undissolved ("suspended"), in liquid ("solvent"). Also, as used herein, a "solution" means a single-phase liquid system in which solid particles are dissolved in liquid ("solvent").

Figure 1B:
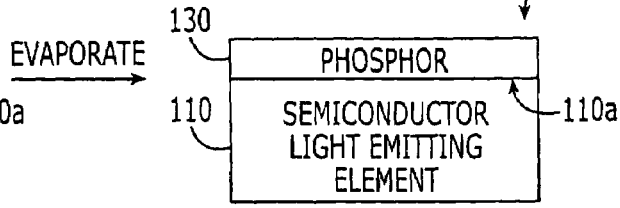

FIG. 1A is a cross-sectional view of a semiconductor light emitting device during an intermediate fabrication step according to various embodiments of the present invention. As shown in FIG. 1A, a suspension 120 comprising phosphor particles 122 suspended in solvent 124 is placed on at least a portion of a light emitting surface 110a of a semiconductor light emitting element 110. As used herein, "light" refers to any radiation, visible and/or invisible (such as ultraviolet) that is emitted by a semiconductor light emitting element 110. At least some of the solvent 124 is then evaporated, as shown by the arrow linking FIGS. 1A and 1B, to cause the phosphor particles 122 to deposit on at least the portion of the light emitting surface 110a, and form a coating 130 thereon comprising the phosphor particles 122. In some embodiments, the suspension 120 comprising phosphor particles 122 suspended in solvent 124 is agitated while performing the placing of FIG. 1A and/or while performing the evaporating. Moreover, as shown in FIG. 1B, evaporating can be performed to cause the phosphor particles 122 to uniformly deposit on at least the portion of the light emitting surface 110a, to thereby form a uniform coating 130 comprising the phosphor particles 122. In some embodiments, the phosphor particles 122 uniformly deposit on all the light emitting surface 110a. Moreover, in some embodiments, substantially all of the solvent 124 can be evaporated. For example, in some embodiments, at least about 80% of the solvent can be evaporated. In some embodiments, substantially all the solvent 124 is evaporated to cause the phosphor particles 122 to uniformly deposit on all the light emitting surface 110a.

In some embodiments of the present invention, the solvent 124 comprises Methyl Ethyl Ketone (MEK), alcohol, toluene, Amyl Acetate and/or other conventional solvents. Moreover, in other embodiments, the phosphor particles 122 may be about 3-4 µm in size, and about 0.2 gm of these phosphor particles 122 may be mixed into about 5 cc of MEK solvent 124, to provide the suspension 120. The suspension 120 may be dispensed via an eyedropper pipette, and evaporation may take place at room temperature or at temperatures above or below room temperature, such as at about 60° C. and/or at about 100° C.

Phosphors also are well known to those having skill in the art. As used herein, the phosphor particles 122 may be Cerium-doped Yttrium Aluminum Garnet (YAG:Ce) and/or other conventional phosphors and may be mixed into the solvent 124 using conventional mixing techniques, to thereby provide the suspension 120 comprising phosphor particles 122. In some embodiments, the phosphor is configured to convert at least some light that is emitted from the light emitting surface 110a such that light that emerges from the semiconductor light emitting device 100 appears as white light.

The semiconductor light emitting element 110 may include a light emitting diode, a laser diode and/or other semiconductor device that includes one or more semiconductor layers, which may include silicon, silicon carbide, gallium nitride, gallium arsenide, and/or other semiconductor materials, a substrate which may include sapphire, silicon, gallium arsenide, silicon carbide and/or other microelectronic substrates, and one or more contact layers, which may include metal and/or other conductive layers. In some embodiments, ultraviolet, blue and/or green LEDs may be provided. The design and fabrication of semiconductor light emitting devices are well known to those having skill in the art and need not be described in detail herein.

For example, light emitting devices according to some embodiments of the present invention may include structures such as the gallium nitride-based LED and/or laser structures fabricated on a silicon carbide substrate such as those devices manufactured and sold by Cree, Inc. of Durham, N.C. The present invention may be suitable for use with LED and/or laser structures that provide active regions such as described in U.S. Pat. Nos. 6,201,262; 6,187,606; 6,120,600; 5,912,477; 5,739,554; 5,631,190; 5,604,135; 5,523,589; 5,416,342; 5,393,993; 5,338,944; 5,210,051; 5,027,168; 5,027,168; 4,966,862 and/or 4,918,497, assigned to the assignee of the present invention, the disclosures of which are incorporated herein by reference in their entirety as if set forth fully herein. Other suitable LED and/or laser structures are described in published U.S. Patent Application Publication No. US 2003/0006418 A1 entitled Group III Nitride Based Light Emitting Diode Structures With a Quantum Well and Superlattice, Group III Nitride Based Quantum Well Structures and Group III Nitride Based Superlattice Structures, published Jan. 9, 2003, as well as published U.S. Patent Application Publication No. US 2002/0123164 A1 entitled Light Emitting Diodes Including Modifications for Light Extraction and Manufacturing Methods Therefor, both assigned to the assignee of the present invention, the disclosures of both of which are hereby incorporated herein by reference in their entirety as if set forth fully herein. Furthermore, LEDs, such as those described in U.S. application Ser. No. 10/659,241, entitled Phosphor-Coated Light Emitting Diodes Including Tapered Sidewalls and Fabrication Methods Therefor, filed Sep. 9, 2003, assigned to the assignee of the present invention, the disclosure of which is incorporated by reference herein as if set forth fully, may also be suitable for use in embodiments of the present invention. The LEDs and/or lasers may be configured to operate such that light emission occurs through the substrate. In such embodiments, the substrate may be patterned so as to enhance light output of the devices as is described, for example, in the above-cited U.S. Patent Application Publication No. US 2002/0123164 A1.

Figure 2A:
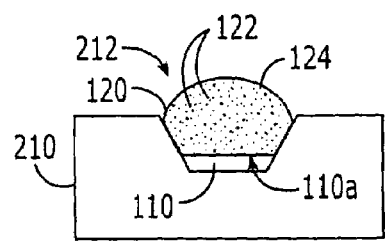

FIG. 2A is a cross-sectional view of other embodiments of the present invention. As shown in FIG. 2A, a mounting substrate 210 is provided, and the semiconductor light emitting element 110 is mounted in a cavity 212 therein. The suspension 120 comprising phosphor particles 122 suspended in solvent 124 is placed in the cavity 212. Thus, the cavity 212 can be used to confine the suspension 120 and thereby provide a controlled amount and geometry for the suspension 120.

Many mounting substrates 210 may be used according to various embodiments of the present invention. In some embodiments, the mounting substrate 210 is a two-piece package for a semiconductor light emitting device wherein the semiconductor light emitting device is mounted on a substrate that comprises alumina, aluminum nitride and/or other materials, which include electrical traces thereon, to provide external connections for the semiconductor light emitting device. A second substrate which may comprise silver plated copper, is mounted on the first substrate, for example using glue, surrounding the semiconductor light emitting device. A lens may be placed on the second substrate over the semiconductor light emitting device. Light emitting diodes with two-piece packages as described above are described in application Ser. No. 10/446,532 to Loh, entitled Power Surface Mount Light Emitting Die Package, filed May 27, 2003, assigned to the assignee of the present invention, the disclosure of which is hereby incorporated herein by reference in its entirety as if set forth fully herein.

Moreover, in other embodiments, the mounting substrate 210 can be a solid metal block, as described in copending application Ser. No. 10/659,108 to Negley et al., entitled Solid Metal Block Mounting Substrates for Semiconductor Light Emitting Devices, and Oxidizing Methods for Fabricating Same, filed Sep. 9, 2003, assigned to the assignee of the present invention, the disclosure of which is hereby incorporated herein by reference in its entirety as if set forth fully herein. The design of mounting substrates 210 are well known to those having skill in the art and need not be described further herein.

Figure 2B:
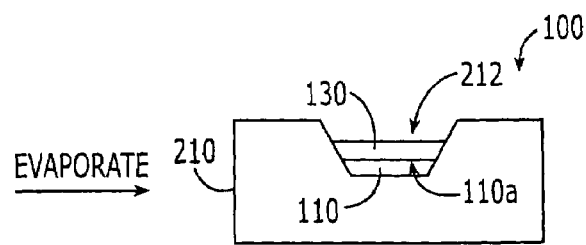

Referring now to FIG. 2B, evaporation is performed, to thereby evaporate at least some of the solvent 124 to cause the phosphor particles 122 to deposit on at least a portion of the light emitting surface 110a, and form a coating 130 comprising the phosphor particles 122.

Figure 3A:
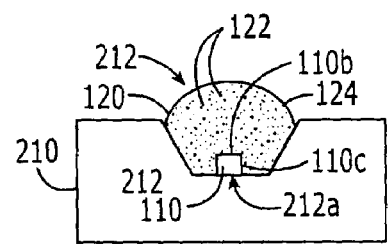
Figure 3B:
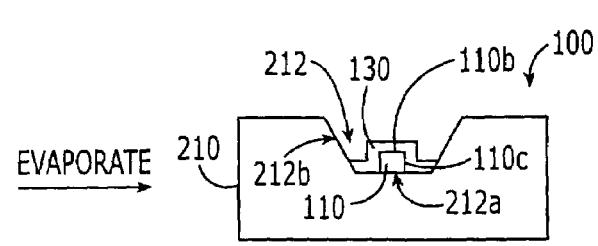

FIGS. 3A and 3B illustrate other embodiments of the present invention. As shown in FIG. 3A, in these embodiments, the cavity 212 includes a cavity floor 212a, and the semiconductor light emitting element 110 is mounted on the cavity floor 212a. Moreover, the semiconductor light emitting element 110 protrudes away from the cavity floor 212a. In some embodiments, the light emitting surface 110a of the semiconductor light emitting element 110 includes a face 110b that is remote from the cavity floor 212a, and a sidewall 110c that extends between the face 110b and the cavity floor 212a. As shown in FIG. 3B, evaporating is performed to evaporate at least some of the solvent 124, to cause the phosphor particles 122 to uniformly deposit on at least a portion of the light emitting surface 110a and thereby form a coating 130 of uniform thickness comprising the phosphor particles 122. As also shown in FIG. 3B, in some embodiments, the coating may be of uniform thickness on the face 110b and on the sidewall 110c. In some embodiments, the coating 130 may extend uniformly on the floor 212a outside the light emitting element 110. In other embodiments, the coating 130 also may extend at least partially onto sidewalls 212b of the cavity 212.

In other embodiments of the present invention, a binder may be added to the suspension 120 so that, upon evaporation, the phosphor particles 122 and the binder deposit on at least the portion of the light emitting surface 110, and form a coating thereon comprising the phosphor particles 122 and the binder. In some embodiments, a cellulose material, such as ethyl cellulose and/or nitro cellulose, may be used as a binder. Moreover, in other embodiments, at least some of the binder may evaporate along with the solvent.

Figure 4A:
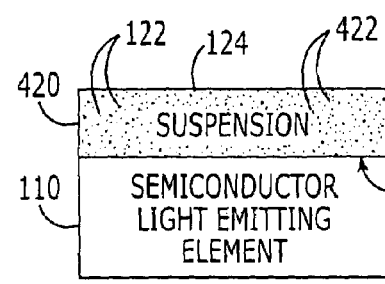
Figure 4B:
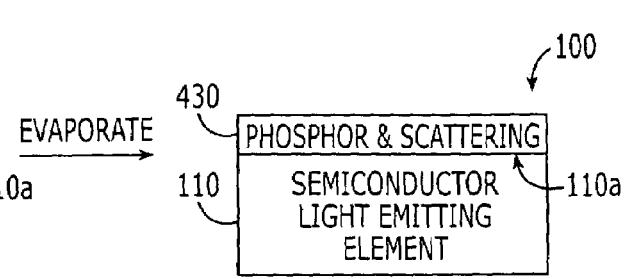

FIGS. 4A and 4B illustrate other embodiments of the present invention wherein the suspension 420 comprises the phosphor particles 122 and light scattering particles 422 suspended in solvent 124, and wherein at least some of the solvent 124 is evaporated to cause the phosphor particles 122 and the light scattering particles 422 to deposit on at least a portion of the light emitting element 110, and form a coating 430 comprising the phosphor particles 122 and the light scattering particles 422. In some embodiments, the light scattering particles 422 may comprise $SiO_2$ (glass) particles. By selecting the size of the scattering particles 422, blue light may be effectively scattered to make the emission source (for white applications) more uniform (more specifically, random), in some embodiments.

It will also be understood that combinations and subcombinations of embodiments of FIGS. 1A-4B also may be provided, according to various embodiments of the invention.

Figure 5A:
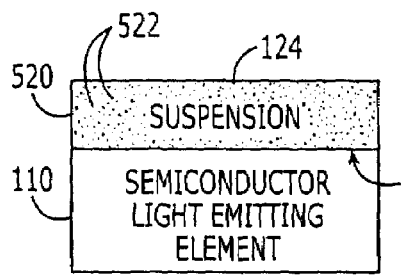
Figure 5B:
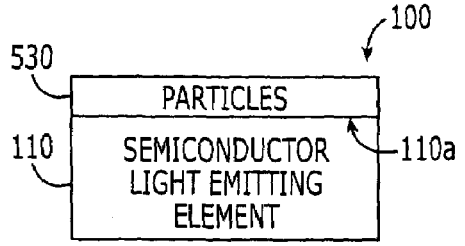

Other embodiments of the invention may be used to provide a coating comprising particles other than phosphor particles 122 or light scattering particles 422 on the light emitting surface of the semiconductor light emitting element. For example, conductive indium tin oxide and/or nano-$TiO_2$ particles 522 illustrated in FIG. 5A may be used. In particular, as shown in FIG. 5A, a suspension 520 comprising particles 522 suspended in solvent 124 may be provided on at least a portion of a light emitting surface 110a of a semiconductor light emitting element 110. Then, as shown in FIG. 5B, at least some of the solvent 124 is evaporated, to cause the particles 522 to deposit on at least a portion of the light emitting surface 110a, and form a coating 530 comprising the particles 522. It will also be understood that embodiments of FIGS. 5A and 5B may be provided in combination and subcombination with embodiments of FIGS. 1A-4B, to deposit phosphor particles 122, light scattering particles 422 and/or other particles 522, according to various embodiments of the invention.

Figure 6A:
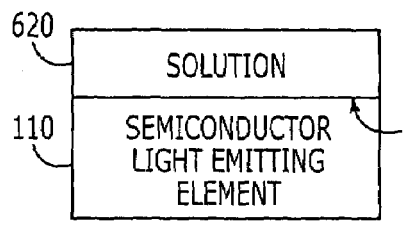
Figure 6B:
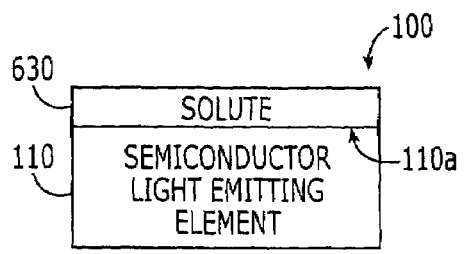

Yet other embodiments of the invention may be used to provide a coating comprising a solute that is dissolved in a solution, on the light emitting surface of a semiconductor light emitting element. In particular, as shown in FIG. 6A, a solution 620 comprising solute dissolved in solvent is placed on at least a portion of the light emitting surface 110a of the semiconductor light emitting element 110. Then, as shown in FIG. 6B, at least some of the solvent is evaporated to cause the solute to deposit on at least the portion 110a of the light emitting surface to form a coating 630 thereon comprising the solute. Accordingly, precipitation from a solution 620 may be used to provide a coating 630 of a solute on a light emitting surface 110a of a semiconductor light emitting element 110 according to these embodiments of the invention. It also will be understood that embodiments of FIGS. 6A and 6B may be provided in combination and subcombination with embodiments of FIGS. 1A-5B, to deposit phosphor particles 122, light scattering particles 422, other particles 522 and/or solute 630 of FIG. 6A, according to various embodiments of the present invention.

Additional discussion of various embodiments of the present invention now will be provided. In particular, some embodiments of the present invention allow self-assembled phosphor-coated light emitting diodes to be fabricated by controlled solvent evaporation of phosphor/solvent suspensions. In some embodiments, a cavity, such as a conventional reflector cavity, may be used to confine the suspension for controlled evaporation. The suspension is applied to a confined volume, for example that of an LED reflector cavity, and the solvent is evaporated from the confined volume. As the solvent evaporates, the material in suspension remains in the cavity. With controlled evaporation, a uniform coating of material may be achieved.

Moreover, in some embodiments, if a particle/solute system is difficult to obtain or maintain such that the particles are in suspension, techniques such as vibration (for example, ultrasonic vibration) can be used to continuously agitate the suspension while dispensing the suspension into the cavity. Additionally, the vibration technique can also be used while evaporating the solvent, to obtain a relatively uniform coating. Evaporation can be performed at room temperature or at reduced and/or elevated temperatures, depending on the choice of solvents. Additionally, vacuum evaporation may also be used to extract the solvent. Other conventional solvents and/or evaporation techniques may be used. A binder can also be incorporated in the suspension for a more rugged coating. Additionally, light scattering particles and/or other particles may also be co-deposited by this technique. By selecting the proper size of light scattering particles, blue light can be effectively scattered, which can make the emission source (for white applications) more uniform (i.e., more specifically random). Finally, solute can be dissolved in solvent and then precipitated out to deposit the solute, in other embodiments.

EXAMPLES

The following Examples shall be regarded as merely illustrative and shall not be construed as limiting the invention.

Figure 7A:
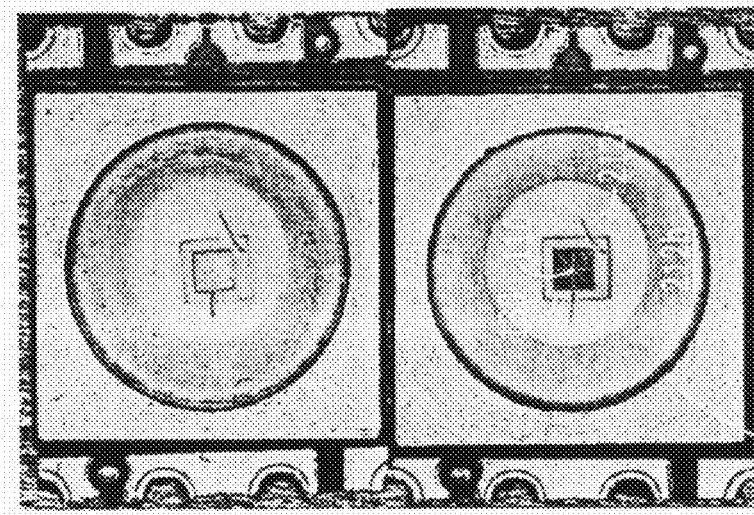
FIGS. 7A-7C are photographs of light emitting devices including phosphor coatings according to various embodiments of the invention.
Figure 7B:
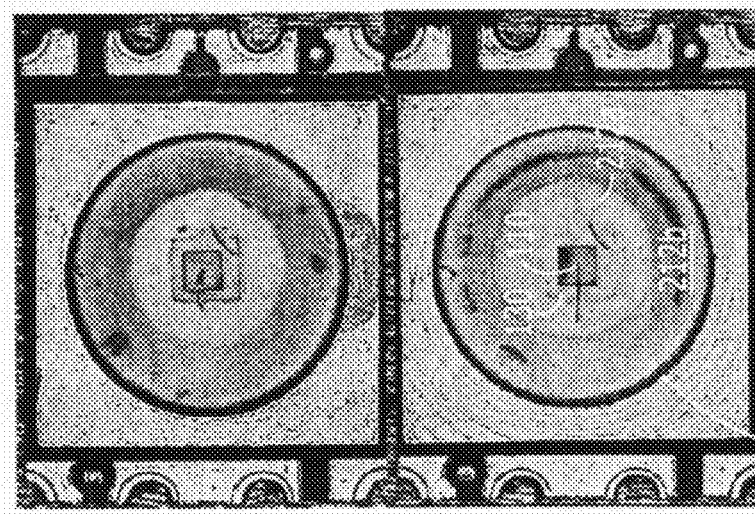
Figure 7C:
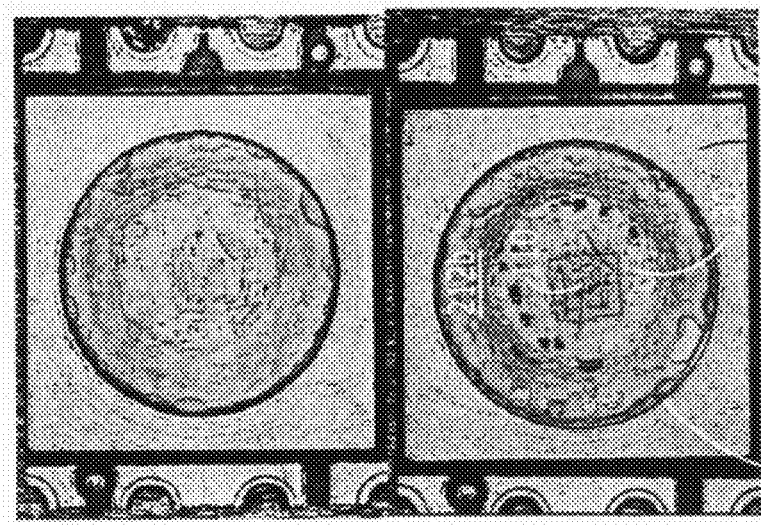

About 0.1 gm of 3-4 µm phosphor was mixed into about 5 cc of MEK and dispensed via an eyedropper pipette into a cavity 212 that contains a semiconductor light emitting element 110 therein. As shown in FIG. 7A, in room temperature evaporation and at low concentration, the phosphor particles 130 did not cover the light emitting element 110. As used herein, "low concentration" means no settling of the particles was observed prior to dispensing. As shown in FIG. 7B, evaporation at about 60° C. and low concentration provided greater coverage. Finally, as shown in FIG. 7C, evaporation at about 100° C. at high concentration provided substantially complete coverage of the light emitting element 110 and the cavity floor 212a. As used herein, "high concentration" means some settling of the particles in the bottle or eyedropper opening was observed prior to dispensing.

Figure 8A:
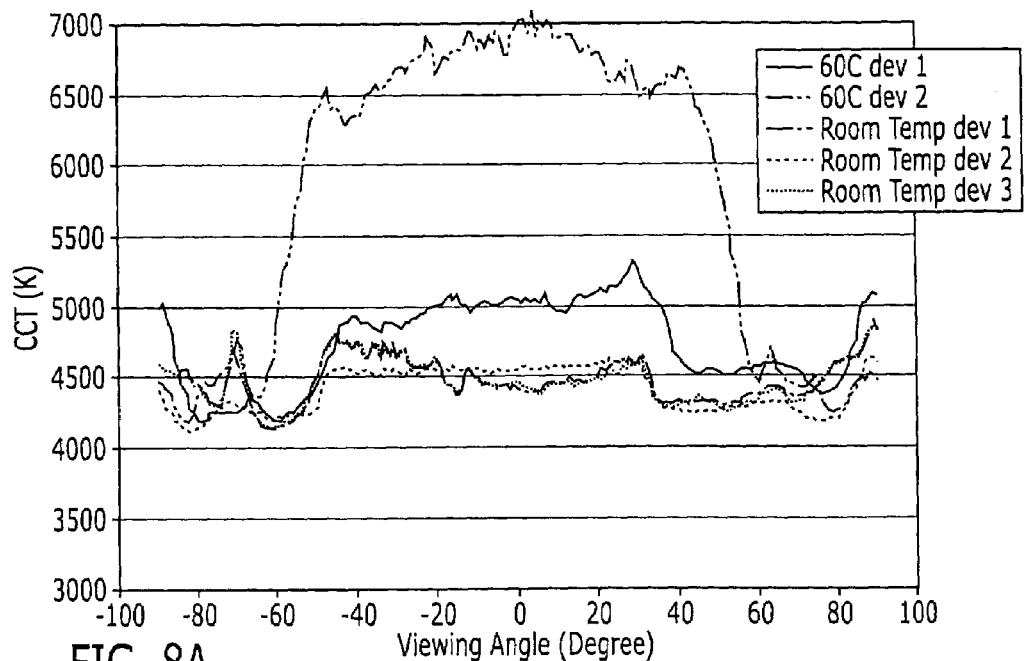
FIGS. 8A and 8B graphically illustrate color correction temperature and luminous intensity, respectively, as a function of viewing angle for phosphor coated light emitting devices according to various embodiments of the present invention.

FIG. 8A graphically illustrates Correlated Color Temperature (CCT) at 100 mA LED current as a function of viewing angle for evaporation at room temperature and at 60° C. using the suspension described above. As shown in FIG. 8A at 60° C. evaporation for device 2, almost no phosphor covered the light emitting top surface, so more blue light can be seen, resulting in a relatively high CCT at 0° angle. The other curves show more uniform covering of phosphor and illustrate more uniform CCT at different viewing angles.

Figure 8B:
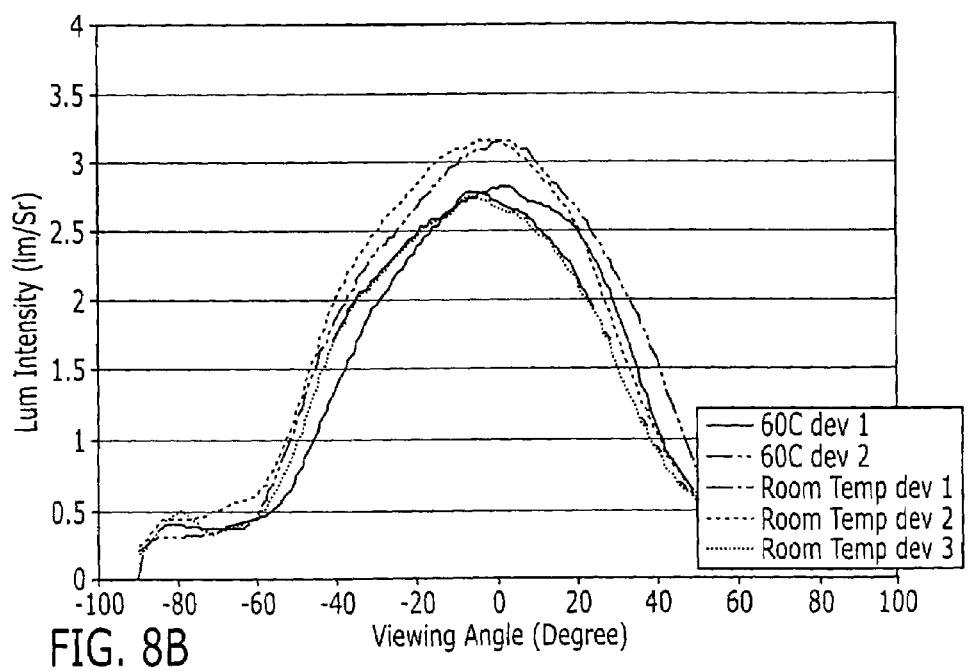

FIG. 8B graphically illustrates luminous intensity as a function of viewing angle under the same conditions as FIG. 8A. As shown in FIG. 8B, high luminous intensities were obtained.

In summary, FIGS. 8A and 8B indicate that relatively uniform phosphor coatings on a light emitting surface may be provided according to embodiments of the present invention.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A method of fabricating a semiconductor light emitting device comprising:
    placing a suspension comprising particles suspended in solvent on at least a portion of a light emitting surface of a semiconductor light emitting element;
    confining the suspension for controlled evaporation on at least a portion of the light emitting surface; and
    evaporating at least some of the solvent to cause the particles to deposit on the at least a portion of the light emitting surface and form a coating thereon comprising the particles.

2. A method according to claim 1, wherein said particles comprise phosphor particles.

3. A method according to claim 1 wherein said suspension is confined in a cavity on the light emitting surface, and wherein placing comprises placing the suspension comprising phosphor particles suspended in solvent in the cavity.

4. A method according to claim 1 further comprising:
    agitating the suspension comprising phosphor particles suspended in solvent while performing the placing and/or the evaporating.

5. A method according to claim 1 wherein evaporating comprises evaporating at least some of the solvent to cause the particles to uniformly deposit on the at least a portion of the light emitting surface and form a uniform coating thereon comprising the particles.

6. A method according to claim 1 wherein evaporating comprises evaporating substantially all of the solvent to cause the phosphor particles to deposit on the at least a portion of the light emitting surface and form a coating thereon comprising the phosphor particles.

7. A method according to claim 1:
    wherein placing comprises placing a suspension comprising particles suspended in solvent and binder on at least a portion of a light emitting surface of a semiconductor light emitting element; and
    wherein evaporating comprises evaporating at least some of the solvent to cause the particles and the binder to deposit on the at least a portion of the light emitting surface and form a coating thereon comprising the particles and the binder.

8. A method according to claim 1:
    wherein placing comprises placing a suspension comprising phosphor particles and light scattering particles suspended in solvent on at least a portion of a light emitting surface of a semiconductor light emitting surface; and
    wherein evaporating comprises evaporating at least some of the solvent to cause the phosphor particles and the light scattering particles to deposit on the at least a portion of the light emitting element and form a coating thereon comprising the phosphor particles and the light scattering particles.

9. A method according to claim 3 wherein placing is preceded by:
    providing a mounting substrate for a semiconductor light emitting device including the cavity therein; and
    mounting the semiconductor light emitting element in the cavity.

10. A method according to claim 3 wherein the cavity includes a cavity floor, wherein the light emitting element is on the cavity floor, wherein the light emitting surface protrudes away from the cavity floor and wherein evaporating comprises:
    evaporating at least some of the solvent to cause the phosphor particles to deposit on at least a portion of the light emitting surface that protrudes away from the cavity floor and on at least a portion of the cavity floor and form a coating thereon comprising the phosphor particles.

11. A method according to claim 3 wherein the cavity includes a cavity floor, wherein the light emitting element is on the cavity floor, wherein the light emitting surface protrudes away from the cavity floor and wherein evaporating comprises:
    evaporating at least some of the solvent to cause the phosphor particles to uniformly deposit on at least a portion of the light emitting surface that protrudes away from the cavity floor and on at least a portion of the cavity floor and thereby form a coating thereon comprising the phosphor particles.

12. A method according to claim 1 wherein evaporating comprises:

evaporating substantially all of the solvent to cause the phosphor particles to uniformly deposit on all the light emitting surface and form a coating thereon comprising the phosphor particles.

13. A method according to claim 1 wherein the solvent comprises Methyl Ethyl Ketone (MEK), alcohol, toluene and/or Amyl Acetate.

14. A method according to claim 7 wherein the binder comprises cellulose.

15. A method according to claim 8 wherein the light scattering particles comprise $SiO_2$ particles.

16. A method according to claim 1 wherein the light emitting surface includes a face and a sidewall that extends from the face, and wherein evaporating comprises evaporating substantially all of the solvent to cause the phosphor particles to uniformly deposit on all the light emitting surface, including on all the face and on all the sidewall and form a coating thereon comprising the phosphor particles.

17. A method according to claim 3 wherein the cavity includes a cavity floor, wherein the light emitting surface includes a face remote from the cavity floor and a sidewall that extends from the face to the cavity floor, and wherein evaporating comprises evaporating substantially all of the solvent to cause the phosphor particles to uniformly deposit on all the light emitting surface, including on all the face and on all the sidewall and form a coating thereon comprising the phosphor particles.

18. A method according to claim 1 wherein the phosphor is configured to convert at least some light that is emitted from the light emitting surface such that light that emerges from the semiconductor light emitting device appears as white light.

19. A solid state emitter chip comprising:
a solid state emitter;
a coating over said solid state emitter, wherein said coating is formed by placing a suspension comprising particles suspended in a solvent on at least a portion of the light emitting surface of said solid state emitter and where at least some of the solvent is evaporated to cause the particles to deposit on and form said coating on said at least a portion of the light emitting surface.

20. The emitter chip of claim 19, wherein said solid state emitter comprises a light emitting diode (LED).

21. The emitter chip of claim 19, wherein said suspension is confined for controlled evaporation on at least a portion of said light emitting surface.

22. The emitter chip of claim 19, wherein said particles comprise phosphor particles.

23. The emitter chip of claim 19, said coating further comprising a binder.

24. The emitter chip of claim 23, wherein said binder is in said suspension with said particles, wherein evaporating said at least some solvent causes the particles and binder to deposit on and form said coating.

25. The emitter chip of claim 24, wherein said binder comprises cellulose.

26. The emitter chip of claim 19, wherein said coating comprises light scattering particles.

27. The emitter chip of claim 19, further comprising a mounting substrate including a cavity therein, said emitter within said cavity.

28. The emitter chip of claim 20, wherein said phosphor is configured to convert at least some light that is emitted from said light emitting surface such that light that is emitted from said chip appears as white light.

29. The emitter chip of claim 19, wherein said coating has a substantially uniform thickness.

30. The emitter chip of claim 19, wherein said coating has a substantially uniform particle concentration.

\* \* \* \* \*

UNITED STATES PATENT AND TRADEMARK OFFICE
CERTIFICATE OF CORRECTION

| | | |
|---|---|---|
| PATENT NO. | : 7,569,407 B2 | |
| APPLICATION NO. | : 11/799702 | |
| DATED | : August 4, 2009 | |
| INVENTOR(S) | : Gerald H. Negley and Michael Leung | |

It is certified that error appears in the above-identified patent and that said Letters Patent is hereby corrected as shown below:

- Column 10, Claim 4, Line 4, reads as: agitating the suspension comprising phosphor particles Should read as: agitating the suspension comprising particles

- Column 10, Claim 6, Line 14, reads as: the phosphor particles to deposit on the at least a portion of the Should read as: the particles to deposit on the at least a portion of the

- Column 11, Claim 12, Line 2, reads as: phosphor particles to uniformly deposit on all the light Should read as: particles to uniformly deposit on all the light

- Column 11, Claim 16, Line 15, reads as: stantially all of the solvent to cause the phosphor particles to Should read as: stantially all of the solvent to cause the particles to

- Column 11, Claim 18, Line 28, reads as: 18. A method according to claim 1 wherein the phosphor is Should read as: 18. A method according to claim 1 wherein the particles are

- Column 12, Claim 28, Line 26, reads as: 28. The emitter chip of claim 20, wherein said phosphor is Should read as: 28. The emitter chip of claim 20, wherein said particles are Signed and Sealed this
Third Day of May, 2011

David J. Kappos
*Director of the United States Patent and Trademark Office*